United States Patent [19]
Shen

[11] Patent Number: 5,754,465
[45] Date of Patent: May 19, 1998

[54] NO PHYSICAL MOVEMENT COMPONENT RECORD REPRODUCE DEVICE AND FLAT DISPLAY DEVICE

[76] Inventor: Xing Liang Shen, 2137 E. 21st St., 1 Fl., Brooklyn, N.Y. 11229

[21] Appl. No.: 151,180

[22] Filed: Nov. 12, 1993

[51] Int. Cl.⁶ .................................................. G11C 11/14
[52] U.S. Cl. ............................. 365/129; 365/19; 365/20; 365/23; 365/32; 365/33; 365/55; 365/74; 365/97
[58] Field of Search .......................... 365/19, 20, 21, 365/23, 32, 33, 55, 66, 74, 97, 129

[56] References Cited

U.S. PATENT DOCUMENTS

| | | | |
|---|---|---|---|
| 3,982,234 | 9/1976 | Voegeli | 365/33 |
| 4,181,979 | 1/1980 | Bobeck | 365/20 |

*Primary Examiner*—David C. Nelms
*Assistant Examiner*—Vu A. Le

[57] ABSTRACT

A non-physical movement component recording and reproducing device produces a pair of special waves with special waveforms that form a special stationary waveform. An electrically-conducting media contains three overlaid layers, a first layer contains the special stationary waveform, a middle layer allows signals to be recorded or be reproduced therein, and a third layer allows the signals to be connected. Two diodes are connected in reverse polarity to the third layer wherein one diode is used for recording and reproducing signals, while the other diode is used for erasing unused signals during the recording process. The bias voltage of the diodes is bigger than the peak value of the special waveform, but less than the maximum peak value of the special stationary waveform. The control unit changes at least one of the intermittence length and the phase of the special waves. The special waves are led to two sides of the first layer and spread in opposite directions therein to form the special stationary waveform. The bias supported diodes prohibit areas, other than under the maximum peak point area, from forming a current that flows vertically through the middle layer, so that the time domain serial signals can be recorded or be reproduced in different locations in the space domain.

6 Claims, 9 Drawing Sheets

NO PHYSICAL MOVEMENT COMPONENT RECORD REPRODUCE DEVICE AND FLAT DISPLAY DEVICE

BACKGROUND OF THE INVENTION

The present invention relates to devices for permanently storing and reproducing analog or digital signals. More particularly, the present invention relates to devices for permanently storing and reproducing analog or digital signals using a non-physical movement component, and to a flat display device using such a component.

Up until now, devices that are widely used for permanently storing and recalling signals include, inter alia, magnetic tapes, magnetic floppy diskettes, and laser CD systems. These devices have a few common characters, inter alia:

1) They require a physical movement component to present different spaces for recording and reproducing; and 2) They only use their surface for recording and reproducing.

Because they require a physical movement component, fast access to a certain location on the recorded media is limited. They also expend more energy, are more complex to make and to design some functions, such as "fast forward", "rewind", and "still", etc. Even though they are more expensive, however, they are not very durable.

Because they only use their surface, they usually are large and heavy, and thereby require more money to produce.

Furthermore, recently, flat display devices use many vertical and horizontal lines to accomplish the deflection function. This method limits high resolution displays and greatly increases manufacturing cost. Another disadvantage is that it is hard to make a big size flat screen.

SUMMARY OF THE INVENTION

Accordingly, several advantages of the non-physical movement recording and reproducing device include, inter alia:

The control unit makes it easy to fit and develop any functions of recording and reproducing appliances, such as "fast forward", "rewind", or "still", etc., in audio and video machines. Access to any specific location on the recorded media is very easy and quick. This is very useful for computers or other appliances.

By using three dimensions or multiple parallel inputs, the present invention can be used to make appliances smaller than traditional devices. Also, the appliances would be more efficient, more durable, more simple in structure, lighter, and less expensive.

Two oscillators generate special waves. The waveform of the special waves have two portions in one period, namely, only one positive and one negative peak which are the same, and one long intermittence which is changed by the control unit.

Two narrow circuits narrow the pulses of the special waves to get a certain record density.

A record media contains three layers that form as a long tape. These three layers lay one on top of each others.

The first layer is called the peak layer. It is made of a conductive material, and is used to form a stationary waveform.

The second layer is called the record layer. It is made of a conductive material that is reactive with certain strength currents, for example, a conductive magnetic material.

The third layer is called the collect layer. It is made of a simple conductive material, and is used to collect signals.

A diode is set with a bias voltage. This bias voltage is less than the maximum peak value of the stationary waveform, but is higher than a single special wave peak value.

The control unit controls the intermittence length of the special waves or the initial phase of the special waves.

Two special waves from oscillators pass through their own narrow circuits. The narrowed special waves input to two sides of the top layer of the record media, i.e. the peak layer. They spread in this layer in opposite directions and form a stationary waveform.

The control unit controls the intermittence of the waves. For example, the length of the right entry wave intermittence is a little longer than that of the left, while the maximum peak point moves from left to right constantly. The special waves initial phases determine the maximum peak start position.

The diode with its bias voltage prohibits other areas of the stationary waveform, other than that under the maximum peak area, from forming a current. Therefore, it is possible that the serial time domain signals can be recorded on different spaces of the record tape.

Accordingly, several advantages of the flat display device include, inter alia:

It is easy to make high resolution flat display screens, big size flat screens, and will greatly reduce the manufacturing costs.

A flat display media contains three two-dimensional layers.

The front layer is made of a conductive and crystal material, and is used to form a two dimensional stationary waveform that contains a vertical or horizontal maximum peak line.

A middle layer is made of a material that is stimulated to emit light under certain electronic power.

The rear layer is made of a conductive material, and is also used to form a two dimensional stationary waveform that contains a horizontal or vertical maximum peak line.

Two pair of deflection systems are similar to the recording and reproducing device, but work in two-dimensional space. The systems contain two pair of special wave generators, two pair of narrow circuits, and two pair of connectors.

Each pair of defection systems generate two special waves. These special waves are inputted to the front layer or the rear layer to form the stationary waveforms that contain a vertical or horizontal maximum peak line. These two maximum vertical and horizontal peak lines cross in space. Their perpendicular line represents the maximum peak voltage.

If we design the middle Layer to emit light only under this maximum peak voltage value, a point of light will be presented on the display screen. If, however, we design the speed of the vertical maximum peak line and the speed of the horizontal maximum peak line to be the same as a TV deflection system, the point of light scans the whole display screen.

A control unit controls each special wave initial phase to synchronize the video signals. The control unit can be further developed to achieve multiple display functions.

The recording and reproducing device works in one dimensional space. The maximum peak point scans the length, and needs one pair of special wave generators. Whereas, the flat display device works in two dimensional space. The maximum peak lines scan in two dimensional layers, so that if we want a point to scan the whole plane, two pair of special wave generators are needed.

The novel features which are considered characteristic of the present invention are set forth in the appended claims. The invention itself, however, both as to its construction and its method of operation, together with additional objects and advantages thereof, will be best understood from the following description of the specific embodiments when read and understood in connection with the accompanying drawing.

BRIEF DESCRIPTION OF THE DRAWING

The figures on the drawing are briefly described as follows.

DETAIL DESCRIPTION OF THE PREFERRED EMBODIMENTS

As we know, sine or cosine waves can form a stationary waveform under a certain condition. If we define a wide meaning stationary waveform, these stationary waveforms will have a peak value that always appears at a fixed position. There can also be other special waves.

Figure 1:
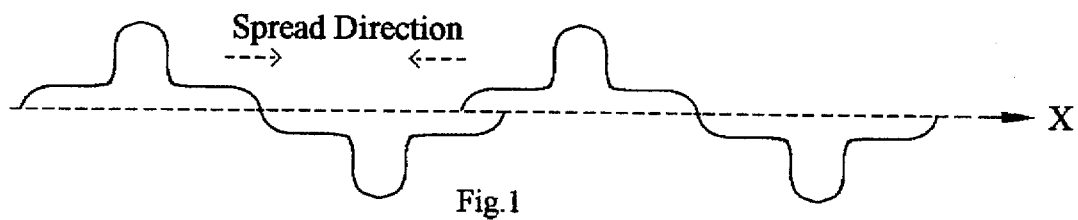
FIG. 1 is a diagrammatic representation of an example of a special waveform that can form the stationary waveform and which contains a maximum peak point.
Figure 2:
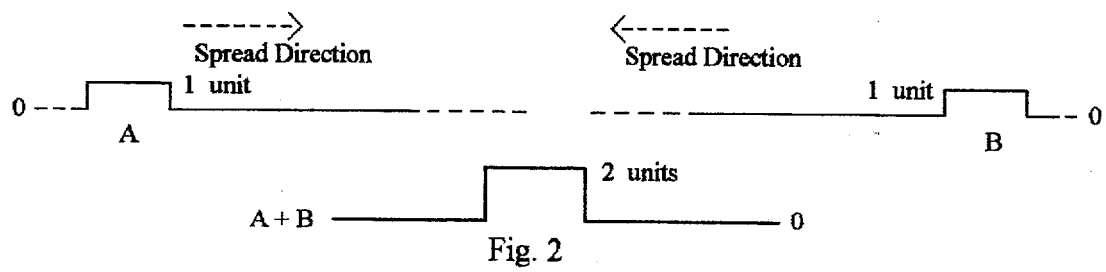
FIG. 2 is diagrammatic representation of another example of the special waveform that can also form the stationary waveform and which also contains a maximum peak point and which is used in the present invention.

Examples of these special waveforms are shown in FIGS. 1 and 2, which are a diagrammatic representation of an example of a special waveform that can form the stationary waveform and which contains a maximum peak point, and a diagrammatic representation of another example of the special waveform that can also form the stationary waveform and which also contains a maximum peak point and which is used in the present invention.

If we take a media length equal to one period of the special waveform length, the stationary waveform will only have one maximum peak value. Changing the initial phase of the special wave, the maximum peak point will form at different locations.

Using this characteristic, we can make a non-physical movement component recording and reproducing device and flat display device.

Two special wave generators can be multi-resonance oscillators.

Figure 3:
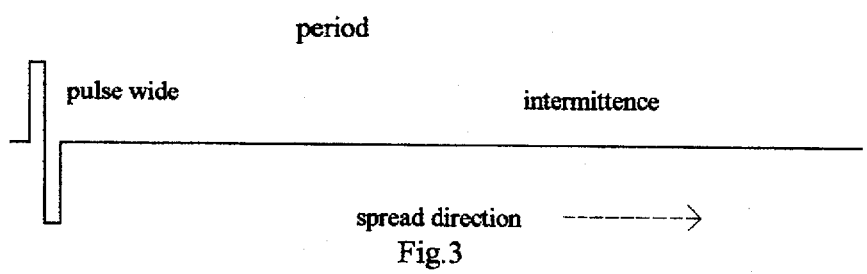
FIG. 3 is a diagrammatic representation of the left side entry waveform used in the present invention.

As shown in FIG. 3, which is a diagrammatic representation of the left side entry waveform used in the present invention, the left entry waveform generated by a fixed frequency oscillator, contains two portions, namely, a positive and a negative pulse whose widths are kept the same to maintain the same recording density, and an intermittence.

The length of the waveform determines the maximum recording length. If the record media length is longer than the waveform length, there will more than one positive and negative pulse appearing in the record media. This situation is not good for recording a time serial signal.

Figure 4:
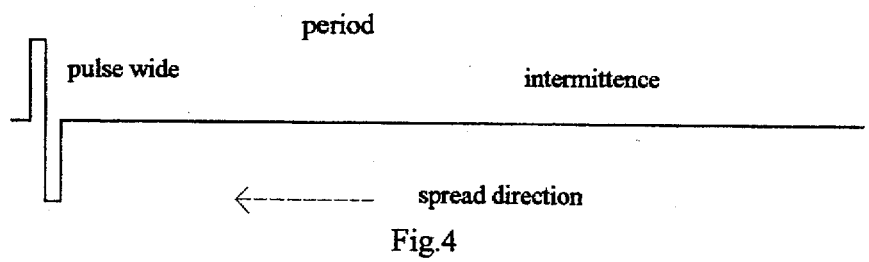
FIG. 4 is a diagrammatic representation of the right side entry waveform used in the present invention.

As shown in FIG. 4, which is a diagrammatic representation of the right side entry waveform used in the present invention, the pulse portion is the same as the left one, but the intermittence length is varied by the control unit. The difference in intermittence between the left and the right waves determines the speed of the maximum peak point movement and the direction of that movement. The greater the difference in the intermittence, the faster the maximum peak point moves. For example, if we design the right wave intermittence to be a little longer than that of the left, after each period, the right pulse is always delayed a little time before it meets the left one. Therefore, the maximum peak point always forms a little to the right of it's prior, as the maximum peak point moves from the left side to the right.

The initial phases of the special waves determine the start position of the maximum peak point movement. At the initial value shown in FIGS. 3 and 4, which again are a diagrammatic representation of the left side entry waveform used in the present invention, and a diagrammatic representation of the right side entry waveform used in the present invention, respectively, the maximum peak point will start at the left end side. If the oscillators continually generate the special waves, then the maximum peak point will appear on the left end side again and move to the right. This function is the "repeat" play. The stationary waveform also contains a negative maximum peak point which is used to clean unused signals.

Figure 5:
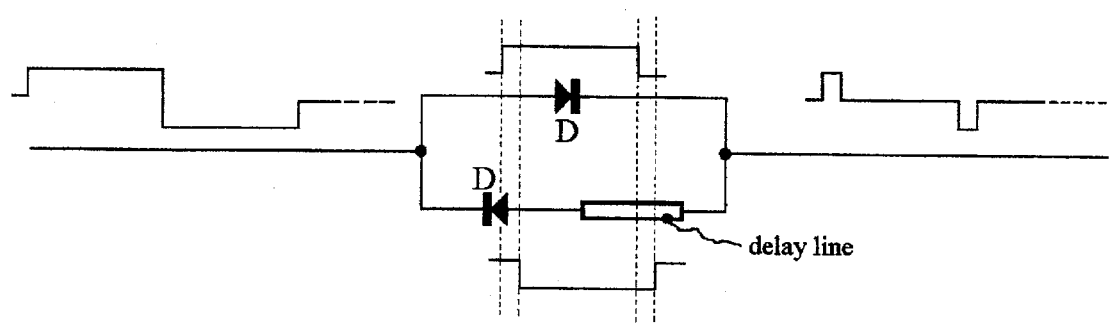
FIG. 5 is a schematic diagram of the narrow circuit utilized in the present invention and the waveform generated thereby.

The width of the maximum peak area determines the record density. If we use a half sine waveform as a pulse, and if a ECG77 transistor is used, the pulse width will be about 83.4 mm. For recording, this pulse is too big. If a 1 mm pulse width is requested, the element has to work at 150,000 MHz. Such high frequency circuits are very hard to design. Therefore, we need a narrow circuit as shown in FIG. 5, which is a schematic diagram of the narrow circuit utilized in the present invention and the waveform generated thereby.

A complete wave from the oscillator is split into two, by two diodes whose polarities are connected reversely. The positive wave passes into the up branch, through a diode, and to the output. The negative wave passes into the down branch, through another diode and a delay line, and to the output. The delay line is designed to delay the negative pulse a little less than half the pulse time. When these two waves come together, most portions thereof cancel each other out, and only narrowed positive and negative pulses (peaks) are delivered to the output.

If, however, a waveform is not an idea pulse, the narrow circuit will still work. In this case, the middle of the output waveform may not cancel completely. This does not affect the device because the bias voltage will ignore that portion that is less than the bias value.

Figure 6:
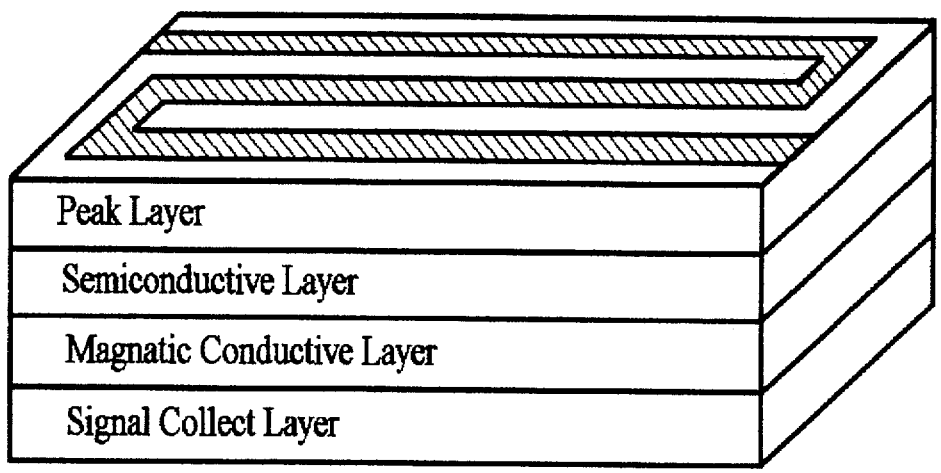
FIG. 6 is a diagrammatic perspective view of an example of a record media.

A example of a record media is shown in FIG. 6, which is a diagrammatic perspective view of an example of a record media. It is to be understood, however, that FIG. 6 it is used only to provide an easy explanation of how the present invention works, and that the actual record media used in the present invention will be discussed, infra.

The record media contains four layers.

The first layer is the peak layer. It is a simple conductive material through which the special waves spread in opposite direction and form a stationary waveform.

Figure 7:
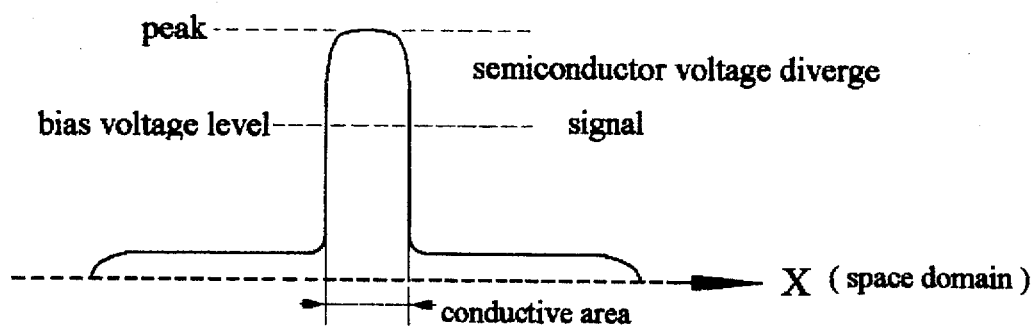
FIG. 7 is an enlarged representation of the stationary waveform and the related conducting area thereof.

The second layer is the semiconductor layer. It allows current to form only under the maximum peak area. This is accomplished by supporting a bias voltage that is higher than one waveform maximum peak value, but lower than the stationary waveform maximum peak value, as shown in FIG. 7, which is an enlarged representation of the stationary waveform and the related conducting area thereof.

The third layer is the record layer in which the signals record. It is designed so that the horizontal resistance is much bigger than the vertical resistance so as to eliminate any possible horizontal current.

The fourth layer is the signal collect layer. It is a simple conductive material.

The first and fourth layers may be made of soft magnetic and conductive material. The soft magnetic characteris is used for avoiding the possible magnetic field created by horizontal current.

Considering that the signal changing speed is much smaller than that of the electric field speed, we can say at certain times, that the signal in a small area is equal everywhere. Therefore, we can connect the bias voltage and signals to the fourth layer anywhere. If the voltage of the other areas is below the bias voltage, only the maximum peak voltage will be higher than the bias. Because the semiconductor layer exists, and the bias voltage supports it, a current that flows through the record layer vertically will be formed under the maximum peak area.

Figure 8:
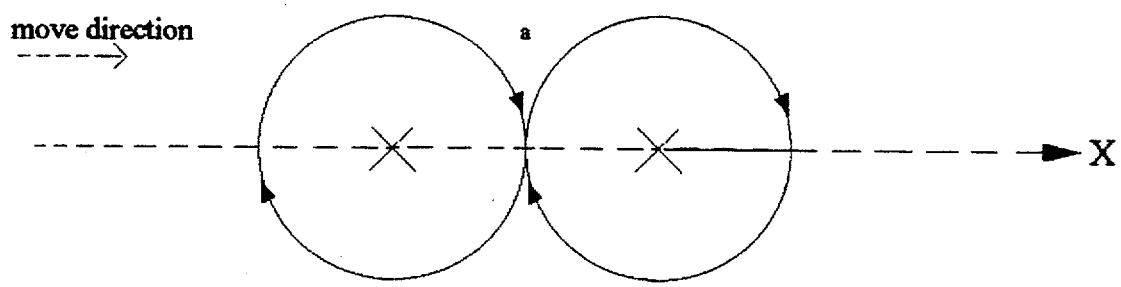
FIG. 8 is a diagrammatic representation of how the vertical current records or reproduces the signal in the record layer of the record media.

With reference to FIG. 8, which is a diagrammatic representation of how the vertical current records or reproduces the signal in the record layer of the record media, lets consider more details about how the vertical current records or reproduces the signals. Assuming that the vertical current flows from the reader into the paper, marked as "X," and assuming that the current moves from left to right, we can see that point "a" will magnetize the record media twice in different directions. The first time it is magnetized by the front of the current magnetic field, where as the second time it is magnetized by the rear of the current field.

Figure 9:
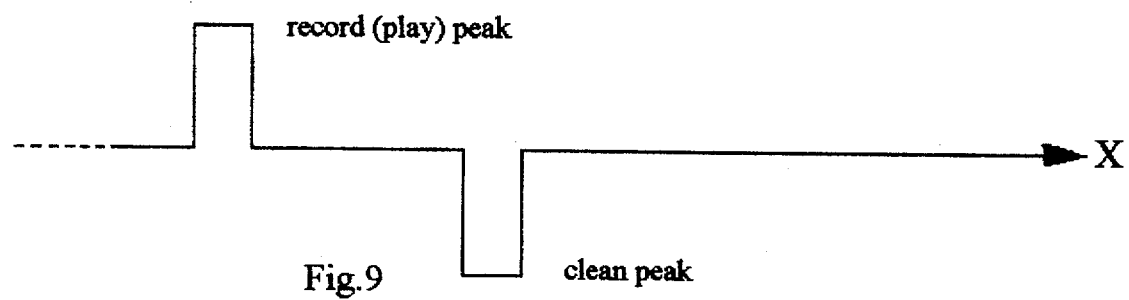
FIG. 9 is a diagrammatic representation of an example of the stationary waveform for recording or reproducing the maximum peak and for erasing the maximum peak.

If we magnetize the record layer in one direction before the recording process, for example, from the top to the bottom, then the front magnetic field will never record on this layer, because this direction is already saturated. Only the rear magnetic field will be recorded. In fact, for cleaning unused signals, we just use the negative maximum peak point area to create a strong current to magnetize the record layer to saturation in the top to bottom direction, as shown in FIG. 9, which is a diagrammatic representation of an example of the stationary waveform for recording or reproducing the maximum peak and for erasing the maximum peak.

When we need to pick up the signals, we can use a weak current that is not strong enough to destroy the original signals. This weak current "cuts" the signal magnetic fields and creates an inductance current that overlays on the weak current and allows the signals to be picked up.

Figure 10:
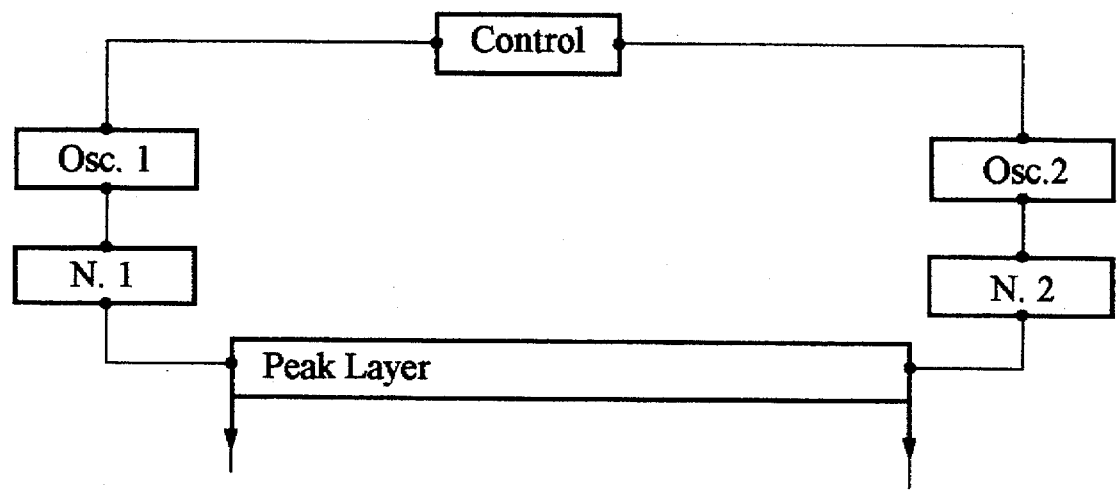
FIG. 10 is a block diagram of the interface of the control unit with the other components of the present invention.

Referring to FIG. 10, which is a block diagram of the interface of the control unit with the other components of the present invention, the control unit controls the length of the intermittence of the right entry special wave to achieve "play" (or "record"), "fast forward", "rewind", "stop", "repeat", etc. functions. Or the Control Unit can control both initial phases of the two special waves to force the maximum peak points to start at a certain position. This function allows the record head, or picking up head, to quickly access a certain point. This may be very useful for computers or other appliances with more potential functions to be developed. For today's technology, it is easy to design new functions. For example, the ability to pick up more than one signal simultaneously, edit signals, etc.

The semiconductor layer shown in FIG. 6, which again is a diagrammatic perspective view of an example of a record media, may greatly increase manufacturing cost because of its large size.

Figure 11:
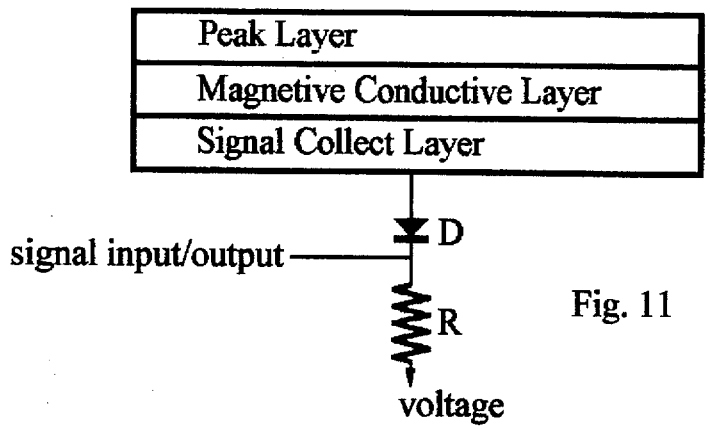
FIG. 11 is a block diagram of the record media used in the present invention interfacing with the diode.

Referring to FIG. 11, which is a block diagram of the record media used in the present invention interfacing with the diode, all layers remain and function the same as those shown in FIG. 6, which again is a diagrammatic perspective view of an example of a record media, except that the semiconductor layer is replaced by a simple diode.

Figure 12:
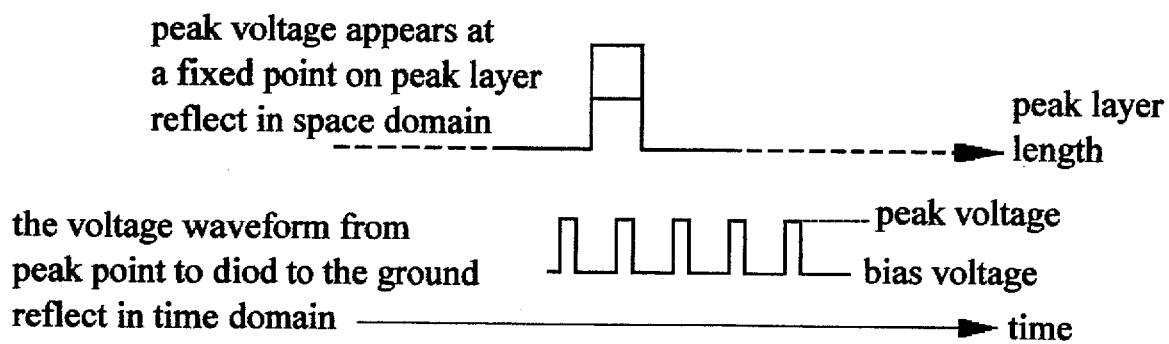
FIG. 12 is a diagrammatic representation of the waveform of FIG. 11.
Figure 13:
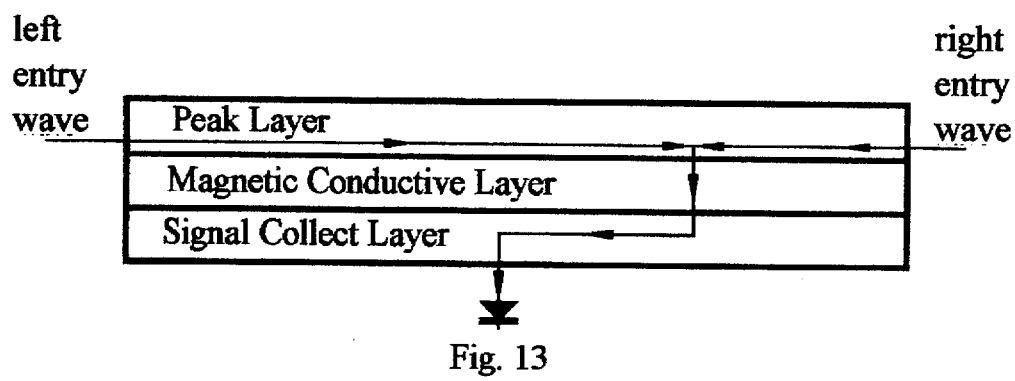
FIG. 13 is a block diagram illustrating the current flow through the record media.

In the first peak layer of the media, the stationary waveform works as a carrier, it reflects in the space domain. The current, which is a normal current that reflects in the time domain, flows from the maximum peak point of the peak layer, through the middle record layer, to the signal collect Layer, and then to the diode. The waveform thereof is shown in FIG. 12, which is a diagrammatic representation of the waveform of FIG. 11, and the current route is shown in FIG. 13, which is a block diagram illustrating the current flow through the record media.

As mentioned, supra, a single special waveform length determines the maximum record length and the special wave functions as the carrier. If we need to handle a video signal, the carrier frequency must be very high. The result is that the record length may be too short. How does one eliminate this limitation?

Figure 14A:
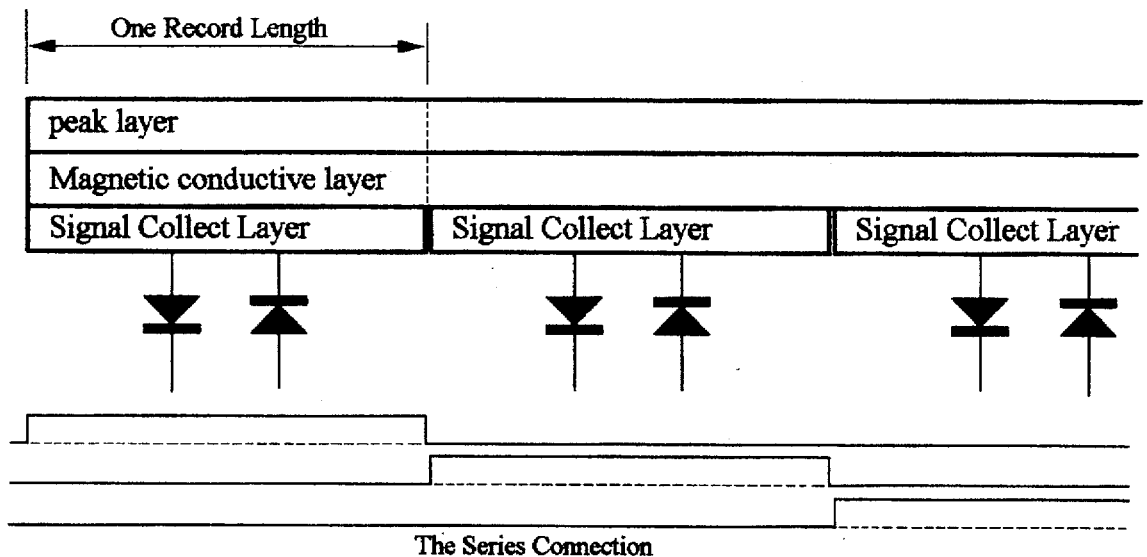
FIG. 14A is a block diagram illustrating the record media connected in series to extend the record length.

The solution is shown in FIG. 14A, which is a block diagram illustrating the record media connected in series to extend the record length.

Many record media are connected in series. The first peak layer and the second record layer may be connected continually, but the third signal collect layers must be separated from each other at each record media length. Anytime there is one maximum peak point in every record media block, the maximum peak points move synchronously.

The diodes of each record media block must serially connect and disconnect, so that each time only one block of record media works. Therefore, the record length may extend to any desired length.

Figure 14B:
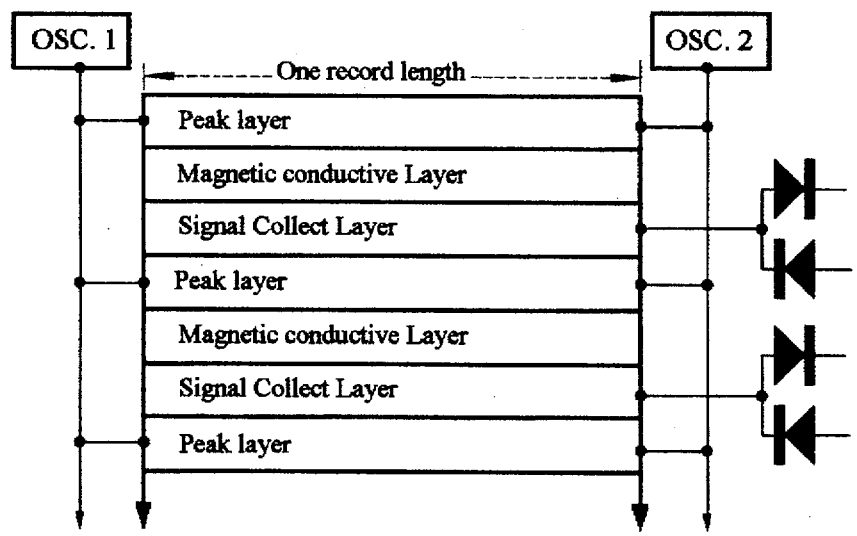
FIG. 14B is a block diagram illustrating the record media connected in parallel to extend the record length.

Another solution is shown in FIG. 14B, which is a block diagram illustrating the record media connected in parallel to extend the record length.

Here the first peak layer and the second record layer are made as two dimensional layers. The length of the original dimension should be kept the same, i.e. its length must be no longer than the length of the special waveform. The third signal collect layer must separate in the same direction. In this direction the special waveform forms a stationary waveform that contains a maximum peak line, not a point. The diodes connected with each third signal collect layer must serial connect and disconnect, so that only one diode works each time. Therefore, we also can get any long record length.

Both the series and parallel connections mentioned, supra, can be further developed to group record media in serial or parallel connection. For example, a group of record media contains 1000 single record media units. Each time one record media unit of the group works, the rest work simultaneously, for example, unit 1001, 2001, 3001 . . . work. When these units finish work, the 1002, 2002, 3002 continue to work. This method provides handling of parallel time domain serial signals.

Figure 15:
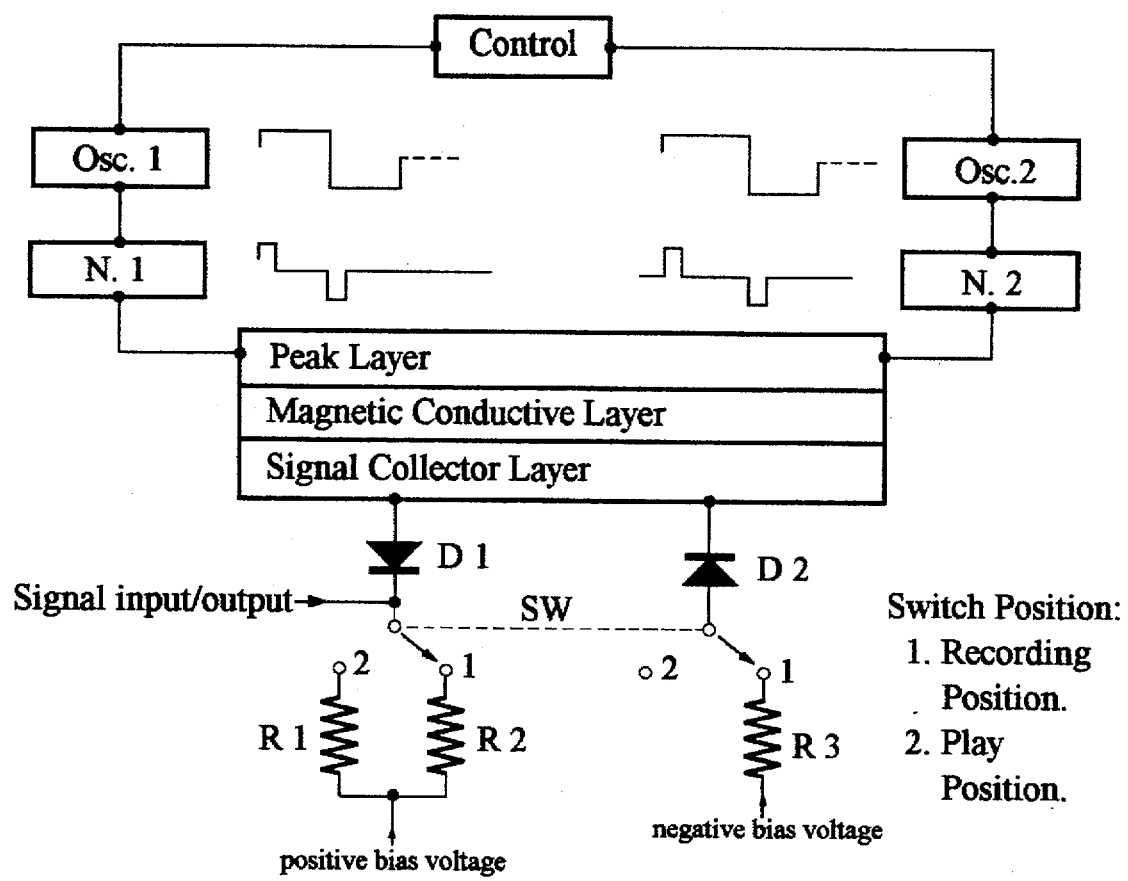
FIG. 15 is a block diagram of the present invention.

Referring to FIG. 15, which is a block diagram of the present invention, there is shown one control unit; two oscillators, i.e. Osc. 1 and Osc. 2; two narrow circuits, i.e. N.1 and N.2; one record media containing the peak layer, the record layer, and the collect layer; and two diodes, i.e. D1 for recording or playing the signal, and D2 for erasing the unused signal during recording.

The Osc.1 and Osc.2 are the special wave generators. After these waves pass through their own narrow circuits, the special waves are led to two sides of the first layer of the record media, where they form a stationary waveform. The control unit controls the intermittence or phases of these special waves. In serial or parallel connection, the control unit also needs to switch the diodes on and off in serial order. Diode D1 is used for recording or reproducing signals. Diode D2 is used for erasing the unused signal during recording. Switch SW is shown in the recording position. Resistance R1 is used for picking up the signals and allows only the weak current to pass through. Resistance R2 is used for recording signals and allows a certain strong, but less than saturation value current, to pass through. Resistance R3 is used for erasing unused signals and allows a saturation current to pass through.

The Flat Display Device uses the same idea, but extends into two dimensional space. There are a few main differences, however, with the audio device:

1) It needs two pairs of special waves to perform the vertical and the horizontal deflections; and 2) The middle layer is used to emit light, not store signals.

Figure 16:
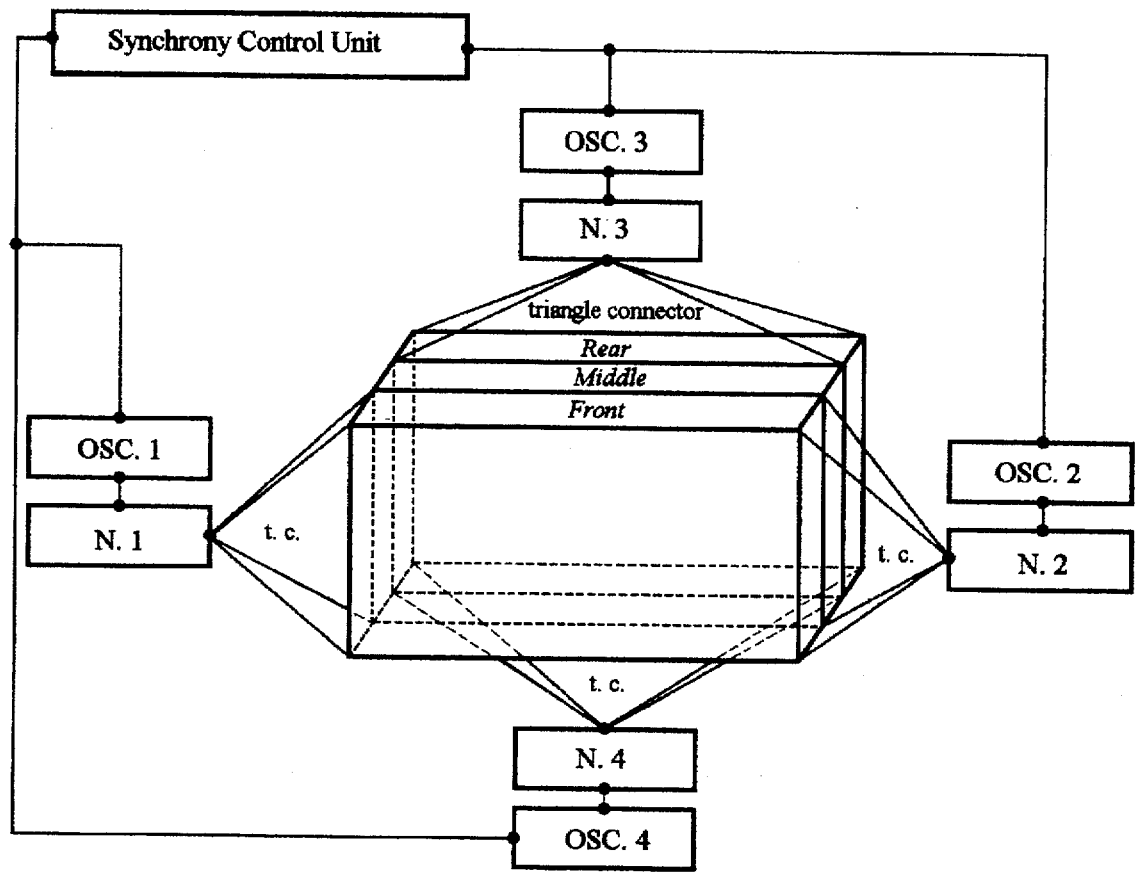
FIG. 16 is a block diagram of the flat display device.

The flat display device is shown in FIG. 16, which is a block diagram of the flat display.

Two pairs of special wave generators OSC. 1, OCS. 2, OCS 3, and OCS 4 compose the vertical and horizontal deflection systems. Each pair of generators only create one maximum peak line. If the vertical system uses a positive maximum peak line, then the horizontal system uses a negative maximum peak line, and their maximum peak lines will cross in space. Their perpendicular line will represent a maximum peak voltage value. If we design for use only under this maximum peak value, the middle layer will be stimulated to emit light, and a light point will appear on the screen. When the vertical and horizontal maximum move from the top to the bottom, and from the left to the right, the light point will scan the whole flat screen.

Figure 17:
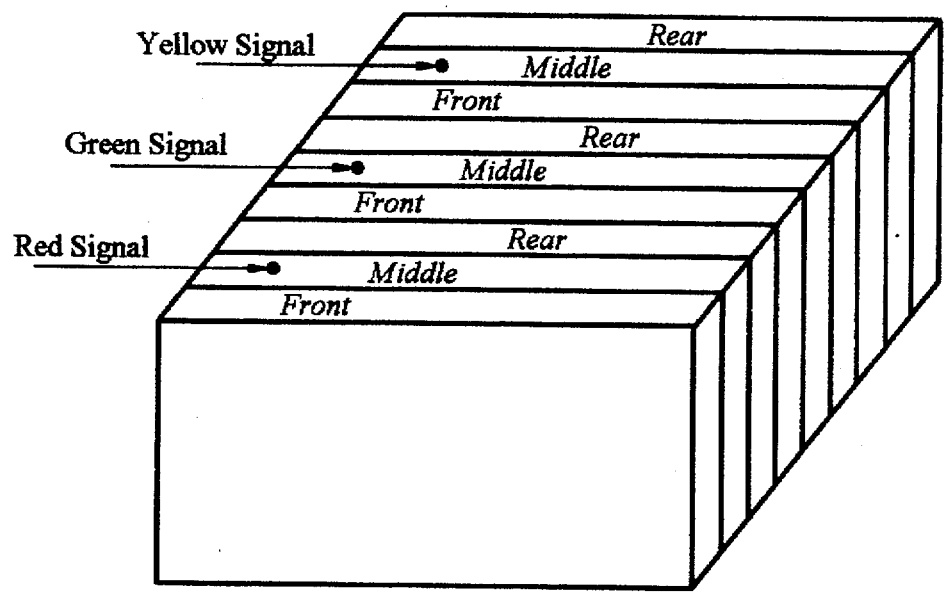
FIG. 17 is a diagrammatic perspective view of the color flat display media of FIG. 16.

A display media contain three layers. A front layer is made of conductive and crystal material. A middle layer is made of a material stimulated to emit light under certain strength electric power. A rear layer is made of a conductive material. The front and rear layers are connected to the deflection systems. The middle layer is connected to a signal source. The whole display media works as a phototransistor. See FIG. 17, which is a diagrammatic perspective view of the color flat display media of FIG. 16.

Two pairs of narrow circuits narrow their own special waves. Two pairs of triangle connections are inserted between the narrow circuits and the front or rear of the display media. Their function is to guarantee that the special waves will form a straight maximum peak line.

The control unit controls the initial phase of every special wave to achieve synchronism with the TV signal.

It will be understood that each of the elements described above, or two or more together, may also find a useful application in other types of constructions differing from the types described above.

While the invention has been illustrated and described as embodied in a non-physical movement component recording reproducing device and flat display device, it is not limited to the details shown, since it will be understood that various omissions, modifications, substitutions and changes in the forms and details of the device illustrated and its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute characteristics of the generic or specific aspects of this invention.

The invention claimed is:

1. A non-physical movement component recording and reproducing device, comprising:

a) means for producing a pair of special waves and its special waveforms contains the pulse portion and the long length intermittence portion and said pair of special waves used to form a special stationary waveform in which contains a maximum peak point area whereby the said maximum peak point area works as a signal carrier;

b) an electrically-conducting media in which contains three layers that overlay one on top of each others, the first layer of said three layers of material in which said special stationary waveform can be formed, the middle layer of said three layers of material reactive with current in which the signals can be recorded or be reproduced and reactively means it characters will be changed under certain strength electrically-power, the third layer of said three layers of material in which the signals can be connected;

c) two diodes that connect to said third layer and their polarities connected reversely, one said diode used for recording and reproducing signals, the other said diode used for erasing unused signals during recording process, each said diodes had their own bias voltage level which is bigger than the peak value of said special waveform but less than the maximum peak value of said special stationary waveform;

d) a control unit by which to change said intermittence length of said special waves, or to change the phase of said special waves, or to change both aid intermittence length and said phase of said special waves whereby the movement of sid maximum peak point area can be controlled; and e) said special waves are led to two sides of said first layer of said media and spread in it at opposite directions to form said special stationary waveform that contains said maximum peak point area, said bias supported diodes prohibit the other areas, only under said maximum peak point area can form a current that flows vertically through said middle layer whereby the time domain serial signals can be recorded or be reproduced in different location of space domain.

2. The device as defined in claim 1, wherein said pulse portion of said special wave further includes a positive pulse and a negative pulse whereby the signals can be recorded and unused signals can be removed synchronously.

3. The device as defined in claim 1, wherein said first and third layers of said three layers are made of soft magnetic and conductive materials whereby to eliminate possible magnetic field's interference and said middle layer is made of magnetic and conductive material whereby the signals can be recorded or be removed permanently.

4. The device as defined in claim 1, wherein said third layer may further divides into multiple parallel lines under the same said first and middle layers whereby the parallel signals can be record or be reproduced or be removed.

5. The device as defined in claim 1, wherein said electrically-conducting media can further be connected in series or parallel connections in which at least said third layers are separated from each other and each recording length time only one block of said electrically-conducting media works for handling single signal or each recording length time only one group of electrically-conducting media work for handling parallel signals whereby the defined structure allows to extend record length to any request long.

6. The device as defined in claim 1, wherein said one said diode has a polarity and is contained in an up branch; said other said diode has a polarity and is contained in a down branch with a delay line wherein said up branch is in electrical communication with said down branch; said polarity of said one said diode is connected reversely to said polarity of said other said diode to split said special wave into said up and down branches and to align the positive pulse and negative pulse in a little staggered position whereby when two branches combine, most portions will cancel each other, only narrowed positive and negative peaks will be delivered to output whereby the certain recording density can be obtained.

* * * * *